US006674298B2

(12) United States Patent
Felici et al.

(10) Patent No.: US 6,674,298 B2
(45) Date of Patent: Jan. 6, 2004

(54) TESTING HEAD HAVING CANTILEVER PROBES

(75) Inventors: Stefano Felici, Robbiate (IT); Giuseppe Crippa, Merate (IT)

(73) Assignee: Technoprobe S.r.l., Cernusco Lombardone (IT)

( * ) Notice: Subject to any disclaimer, the term of this patent is extended or adjusted under 35 U.S.C. 154(b) by 62 days.

(21) Appl. No.: 09/922,002

(22) Filed: Aug. 3, 2001

(65) Prior Publication Data

US 2002/0067178 A1 Jun. 6, 2002

(30) Foreign Application Priority Data

Aug. 4, 2000 (IT) .................................... MI2000A1834

(51) Int. Cl.$^7$ ............................................. G01R 1/073
(52) U.S. Cl. ...................................... 324/762; 324/754
(58) Field of Search ................................ 324/762, 754, 324/761, 758, 765

(56) References Cited

U.S. PATENT DOCUMENTS 5,926,028 A * 7/1999 Mochizuki .................. 324/762

* cited by examiner

*Primary Examiner*—Ernest Karlsen
(74) *Attorney, Agent, or Firm*—Robert Iannucci; Seed IP Law Group PLLC

(57) ABSTRACT

A testing head having cantilever probes is presented. The testing head, comprises a backing ring and a resin holder attached to the backing ring, as well as a plurality of contact probes held by the resin holder and formed with respective contact tips arranged to mechanically and electrically contact a plurality of contact pads of at least one device to be tested. The holder is formed with at least one suitably shaped outline to allow different probe rows to emerge in a cantilever manner.

49 Claims, 8 Drawing Sheets

TESTING HEAD HAVING CANTILEVER PROBES

BACKGROUND OF THE INVENTION

1. Field of the Invention

The present invention relates to a testing head having cantilever probes, and more particularly to a testing head for use on semiconductor integrated devices.

2. Description of the Related Art

As is well known, a testing head is basically a device suitable to electrically interconnect a plurality of contact pads of a microstructure and the corresponding channels of a testing machine that is to perform the tests.

Integrated circuits are factory tested in order to spot and reject any circuits which are already defective during the production phase. The testing heads are normally employed to electrically test the integrated circuits "on wafer", prior to cutting and mounting them in a chip package.

As schematically shown in FIGS. 1 and 2, a testing head 1 having cantilever probes usually comprises a backing ring 2, made of aluminum or ceramics, to which a resin holder 3 is attached, and that is suitable to hold a plurality of movable contact elements or probes 4, being normally wires made of special alloys having good electrical and mechanical properties, the probes being mounted to jut out of the resin holder 3 at plural points 5 and at a suitable angle from a plane β. Such emerging probes are commonly known as "cantilever probes".

In particular, each probe 4 has an end portion or contact tip 6, which is bent with an angle γ from the rest of the probe so that a plurality of contact pads 7 of a device to be tested is contacted. The bent contact tips 6 are commonly referred to as the "crooks".

The good connection of the probes 4 of the testing head 1 to the contact pads 7 of a device to be tested is ensured by the testing head 1 exerting a pressure on the device, whereby the probes 4 are vertically flexed in the opposite direction from the device movement towards the testing head 1.

As schematically shown in FIG. 3 for a single probe 4, as the device to be tested vertically moves against the contact tip 6, the probe 4 flexes, and its elbow point X, situated at the transition from the contact tip 6 to a probe section 8 emerging from the resin holder 3, describes a circular arc.

Thus, the jutting probe section 8 forms a working arm of the probe 4 adapted to flex vertically, and is commonly referred to as the "free length" of the probe.

The crooked shape of the probes 4 is designed to allow the contact tips 6 of the probes 4 to skid, upon coming in touch with the contact pads 7 of the device to be tested and during the pad overtravel beyond a pre-set point of contact, across the contact pads 7 along a direction dictated by the arrangement geometry.

It should be noted that the force exerted on the contact pads 7 by each probe 4 depends on many factors, among which are especially the type of material forming the probe 4, the probe shape, the angle α made by the probe contact tip 6, the length of the probe jutting section or free length 8, and the amount of overtravel of the pads to be measured. These factors also determine the extent of the contact tips 6 skidding on the contact pads 7, this being commonly known as the "scrub".

It should be noted that, with a dense distribution of the contact pads 7, the probes 4 must be arranged in plural rows, and the lengths $L_1, \ldots L_n$ of the crooked ends vary accordingly, as schematically shown in FIG. 4.

Also known is to use backing rings 2, generally made of aluminum or ceramics, having different shapes depending on the set of contact pads 7 to be tested, so that the free lengths of the probes 4, and hence the forces exerted by the latter to the contact pads 7, can be equalized in the interest of even wear and performance of the testing head 1.

In particular, when the probes 4 are arranged in a plurality of rows or levels, as schematically shown in FIGS. 5A, 5B and 5C, the emerging points 5 of the probes 4 from the resin 3, when viewed frontally, make either a diagonal (FIG. 5A), or straight (FIG. 5B), or combination pattern (FIG. 5C) that is dependent on constructional requirements.

The portions of the probes outside the backing ring 2 are usually soldered on a PC board 9, as shown in FIG. 1, to establish an electrical connection between the testing head 1 having cantilever probes and the testing machine.

It is therefore necessary that the outer portion of any probe 4 can be recognized unfailingly in the probe bunch, so that it can be soldered on the PC board 9 in the correct manner.

In addition, the probes 4 extend with their sections outside the backing ring 2 parallel to one another, as shown in FIG. 6A (side A), and the probes 4 for soldering on the PC board 9 are not easily singled out. It is also known the use of probes 4 with a radial spreading in their portion outside the backing ring 2, as schematically shown in FIG. 6A (side B).

The probes 4 can be arranged in a plurality of rows or layers such that they have a diagonal or a straight configuration, in either the case of parallel or radial probes, as shown in FIG. 6A.

FIG. 6B shows, by way of example, an arrangement of the probes 4 in three rows with a radial diagonal configuration, and FIG. 6C shows an arrangement of the probes 4 in three rows with a radial straight configuration.

It is, moreover, a known fact that certain electronic devices, e.g. memories, have contact pads disposed along two sides only. Accordingly, a number of such devices can be tested in parallel if they are set in a single row.

A row of devices can be tested by suitably calibrating the inside dimensions of the backing ring 2.

When several rows of devices are to be tested in parallel—usually two rows of eight devices or four rows of eight devices—multi-bridge backing rings, schematically shown in FIGS. 7A and 7B, are used.

In particular, a multi-bridge backing ring 2b includes a plurality of bridges 2c having a width dimension P inside the ring 2b perimeter, which bridges are suitable to carry probes for several devices to be tested in parallel. There are various techniques that can be used in order to obtain the desired pressure uniformity on the probes 4 against the corresponding contact pads 7.

A first known technique uses a multi-bridge backing ring 2b having plural bridges 2c inside its perimeter to define plural device rows FILA1, FILA2, . . . as schematically shown in FIGS. 7A and 7B.

The shape and dimensions of the multi-bridge backing ring 2b and the inner bridges 2c are selected such that the jutting sections or free lengths $FL_1, FL_2, FL_3, FL_4, \ldots$ of all the probes will be equalized. In this way, the probes 4 are all caused to abut on the contact pads 7 with the same force.

A limitation comes to this prior technique from that the minimum width $L_{min}$ of a device to be tested cannot be less than the sum of the minimum length $FL_{min}$ of the jutting section or minimum free length $FL_1, FL_2, \ldots$ of the probes 4 and the minimum theoretical width $P_{min}$ of each inner bridge 2c, i.e.:

$$L_{min} \geq FL_{min} + P_{min}, \quad (1)$$

as schematically shown in FIG. 7A.

A second prior technique uses probes of different types bound to the same backing ring 2, as schematically shown in FIGS. 8A and 8B.

In particular, probes 4 of a larger diameter are used for the innermost contact pads 7 within the backing ring perimeter, to have equal forces exerted on the contact pads 7 even though the jutting sections or free lengths FL1, FL2, . . . may be different.

Using this technique, however, the dimensions and free lengths of the probes 4 are difficult to calibrate for an even pressure on all the contact pads 7. In addition, the probes 4 which are to reach devices located farther inwards than the probe emergence points on the backing ring 2 will be those having the largest dimensions, as having the greatest jutting sections or free lengths 8, thus enforcing reduced density for the contact pads 7 on the devices.

Also, neither of the above prior techniques would work where a large number of devices are to be tested in parallel. In particular, the testing heads so provided cannot test more than two rows of devices, and are definitely incapable of testing a matrix array of devices.

SUMMARY OF THE INVENTION

Embodiments of this invention provide testing heads for microstructures, having a configuration which can facilitate the operations of sorting out probes and soldering them on a PC board, specifically densely clustered probes, and allowing an unlimited number of devices laid into plural rows to be tested.

One of the principles on which embodiments of the present invention stand is one of suitably shaping the resin holder attached to the probe backing ring in order to provide a clearer view of each probe in a cluster of probes during the soldering steps, while also maintaining an accurate control of the probe jutting sections or free lengths when a plurality of devices are under parallel test.

Presented is a testing head having cantilever probes and comprising a backing ring and a resin holder attached to the backing ring, as well as a plurality of contact probes held by the resin holder and formed with respective contact tips arranged to mechanically and electrically contact a plurality of contact pads of at least one device to be tested, the holder being formed with at least one suitably shaped outline to allow different probe rows to emerge in a cantilever manner. Additionally presented is a method of creating an electro/mechanical connection between a testing head and a test device.

The features and advantages of a testing head according to the invention will become apparent from the following description of embodiments thereof, given by way of non-limiting examples with reference to the accompanying drawings.

DETAILED DESCRIPTION OF THE PREFERRED EMBODIMENTS

Figure 1:
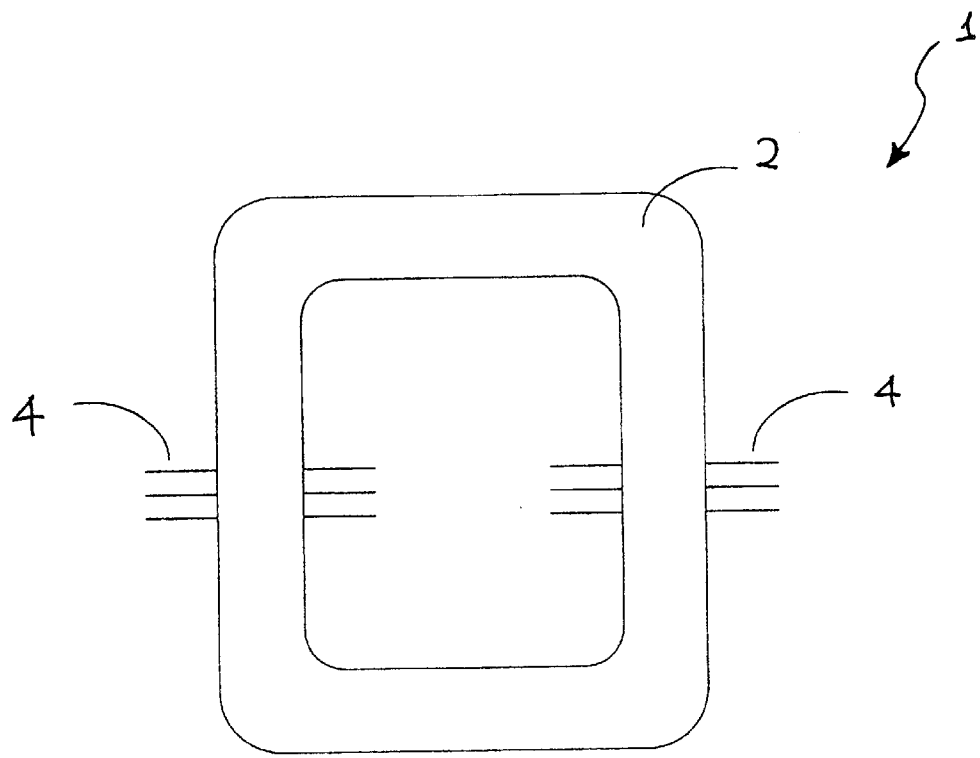
FIG. 1 is a top plan view of a testing head having cantilever probes, according to an embodiment of the prior art.
Figure 2:
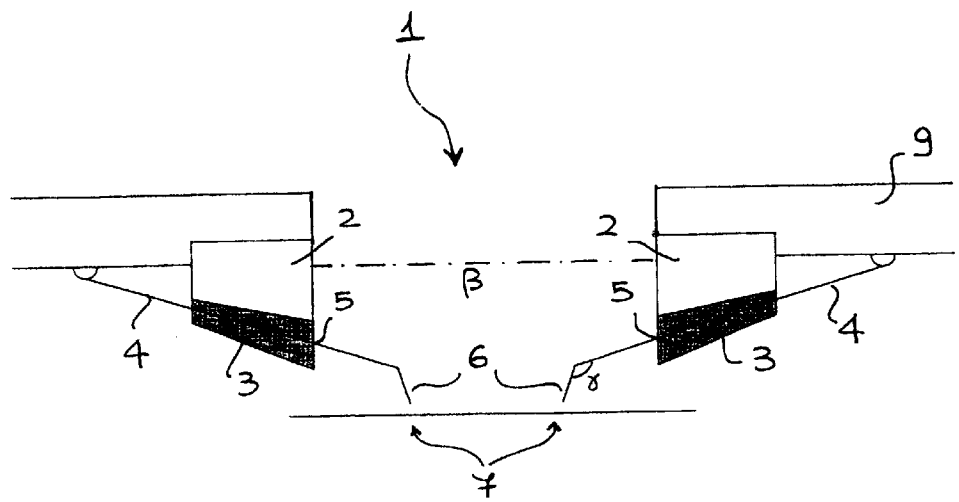
FIG. 2 is a sectional view of the testing head having cantilever probes according to the embodiment of FIG. 1.
Figure 3:
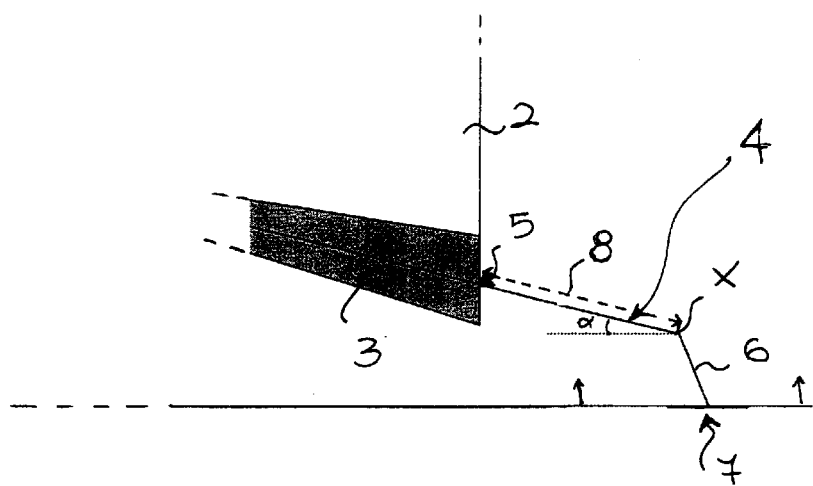
FIG. 3 is a sectional view of a detail of the testing head having cantilever probes according to the embodiment of FIG. 1.
Figure 6A:
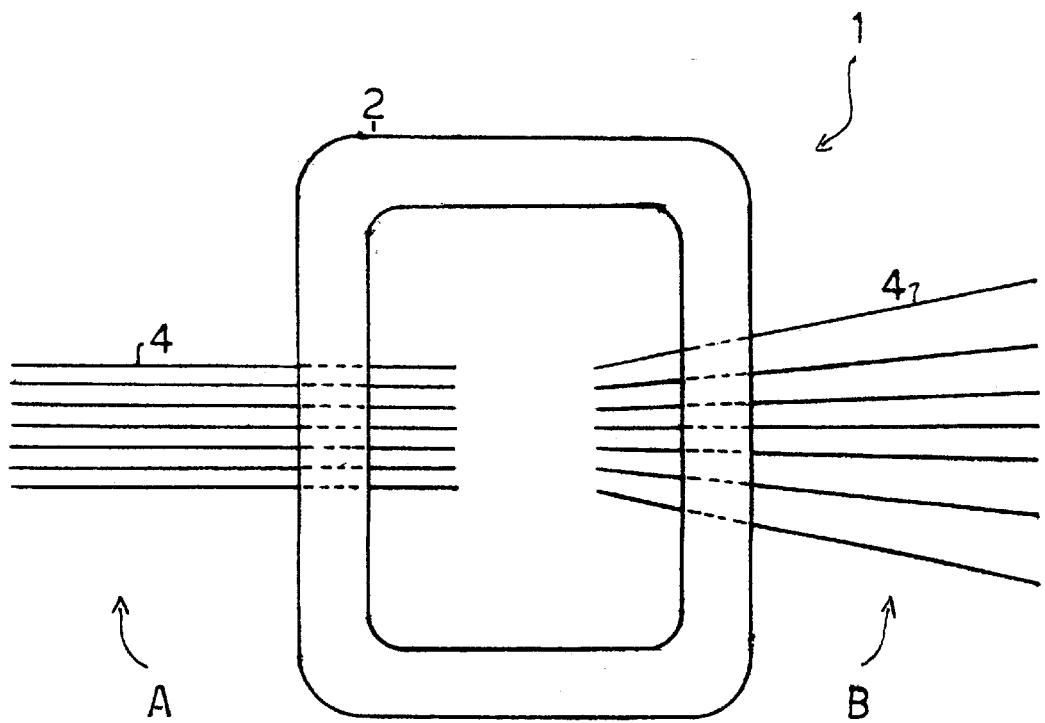
FIGS. 6A, 6B and 6C are schematic views of a testing head having cantilever probes according to a further embodiment of the prior art.
Figure 4:
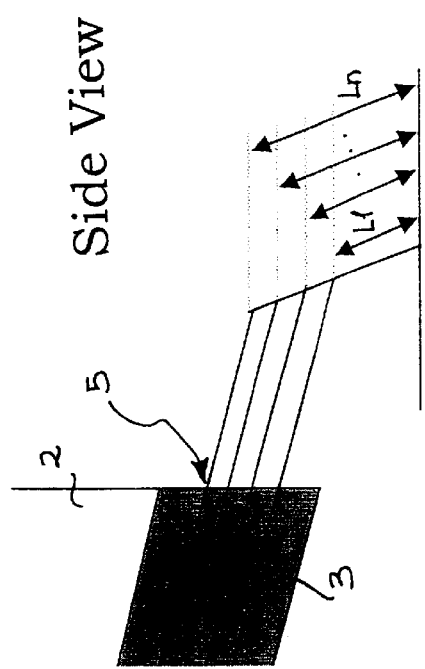
FIG. 4 is a sectional view of a detail of a testing head having cantilever probes according to a further embodiment of the prior art.
Figure 5C:
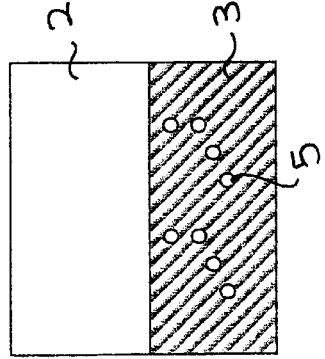
FIGS. 5A, 5B and 5C are schematic sectional views of a detail of the testing head having cantilever probes according to the embodiment of FIG. 4.
Figure 5B:
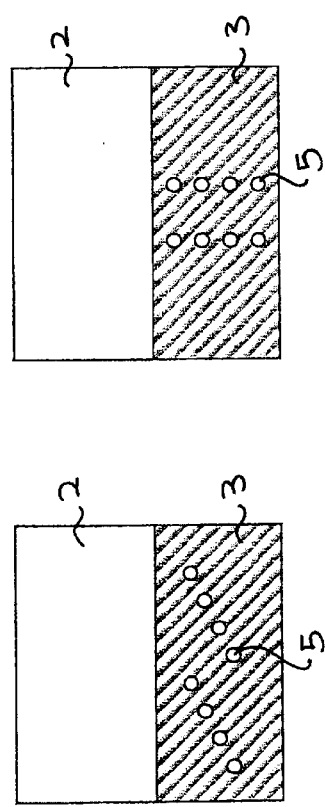
Figure 5A:
Figure 6C:
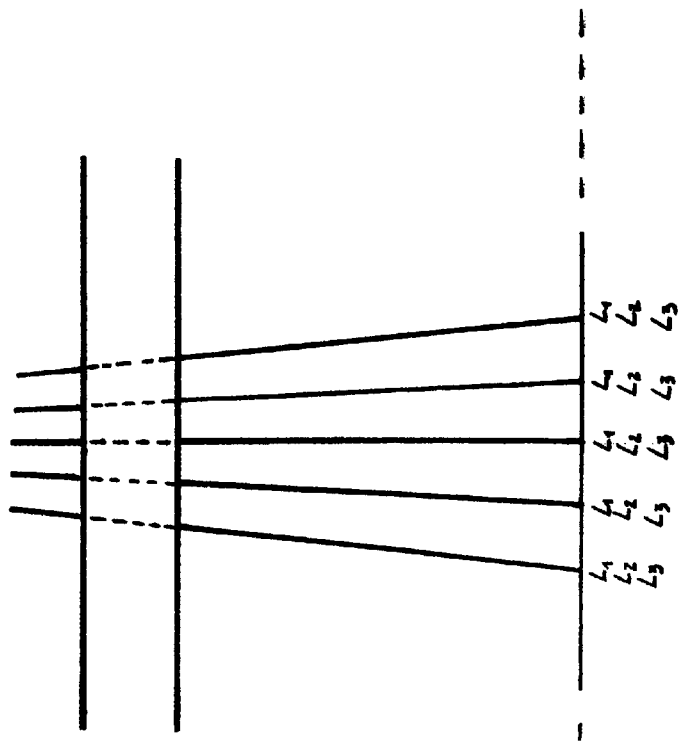
Figure 6B:
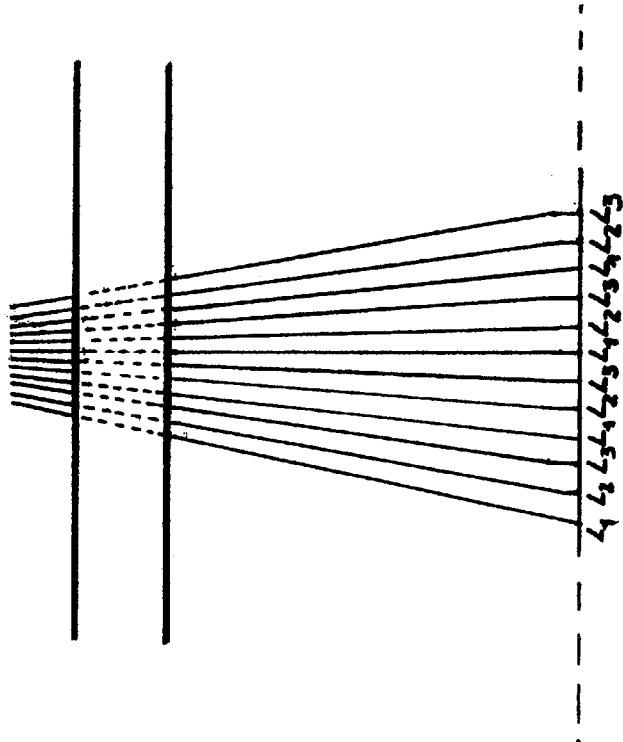
Figure 7A:
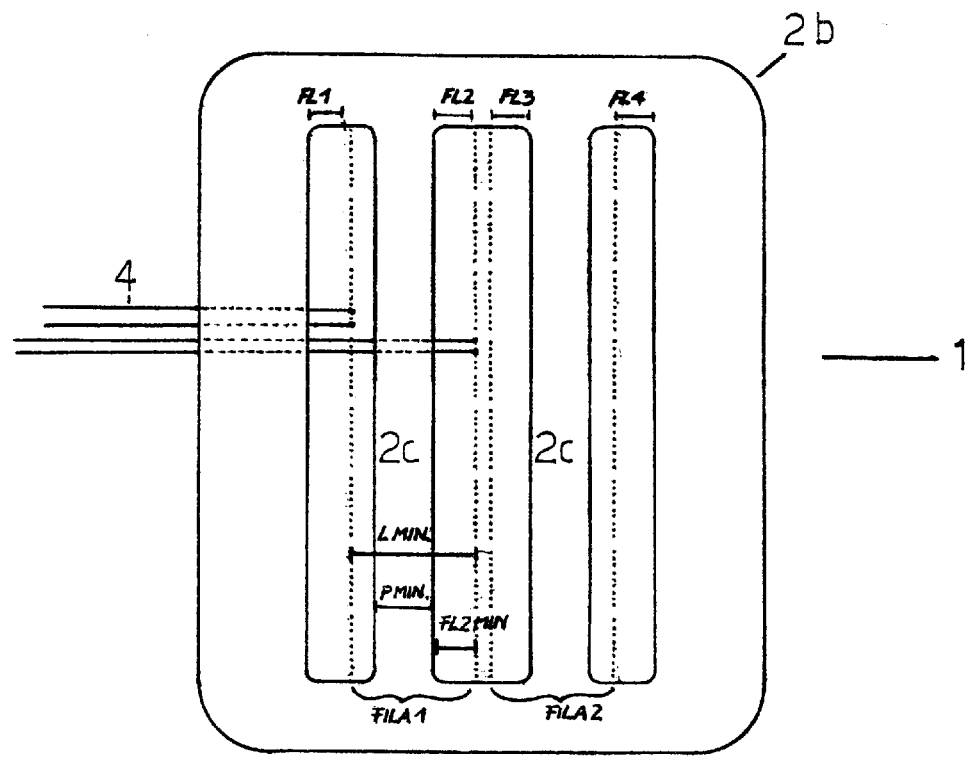
FIGS. 7A and 7B are schematic views of a testing head having cantilever probes according to a further embodiment of the prior art.
Figure 7B:
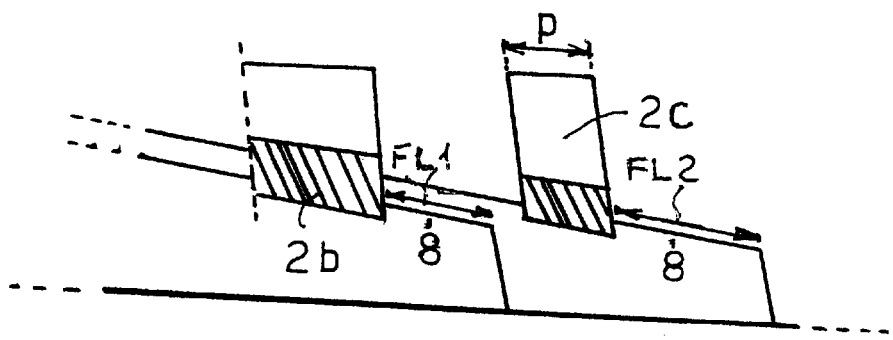
Figure 8A:
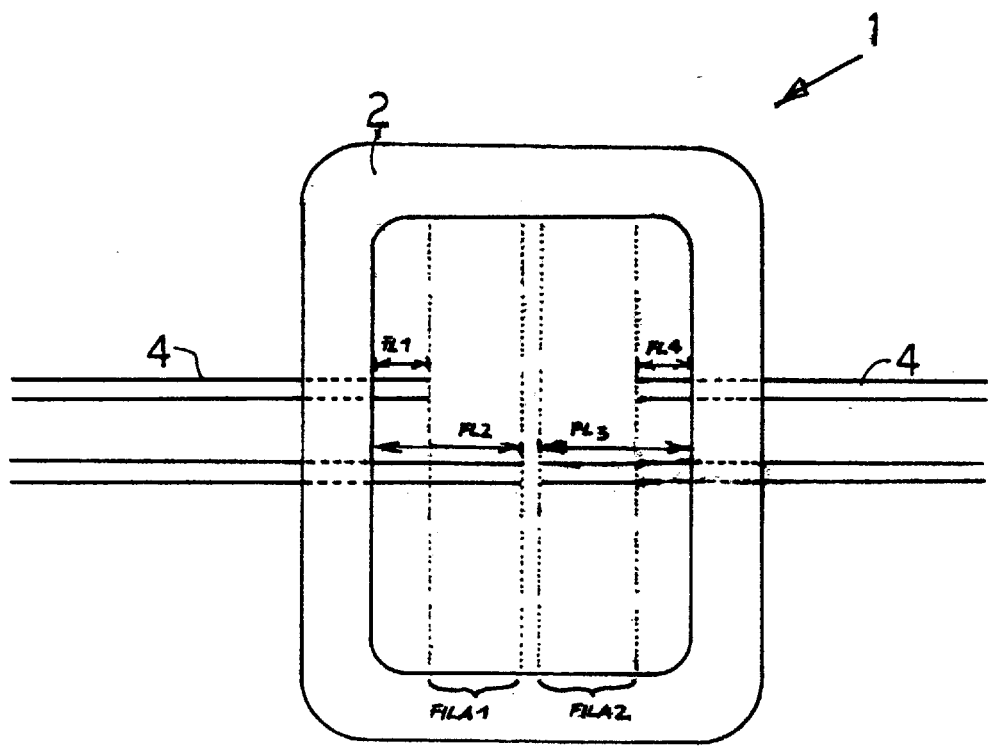
FIGS. 8A and 8B are schematic views of a testing head having cantilever probes according to a further embodiment of the prior art.
Figure 8B:
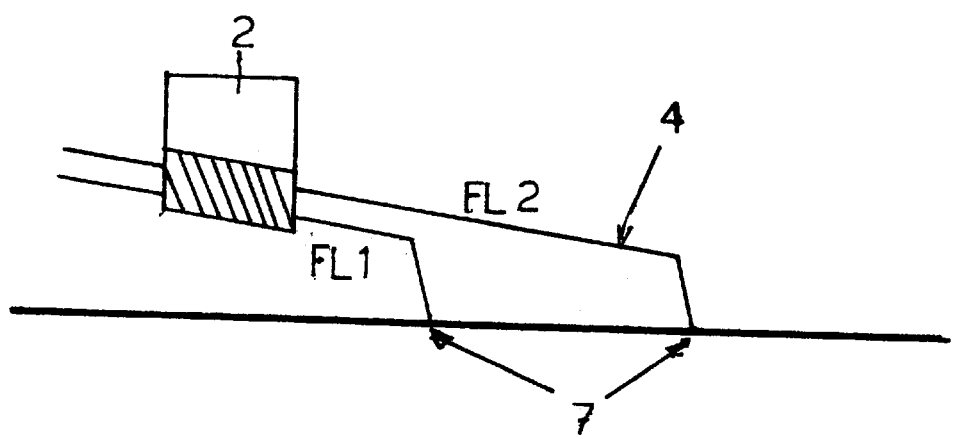
Figure 9:
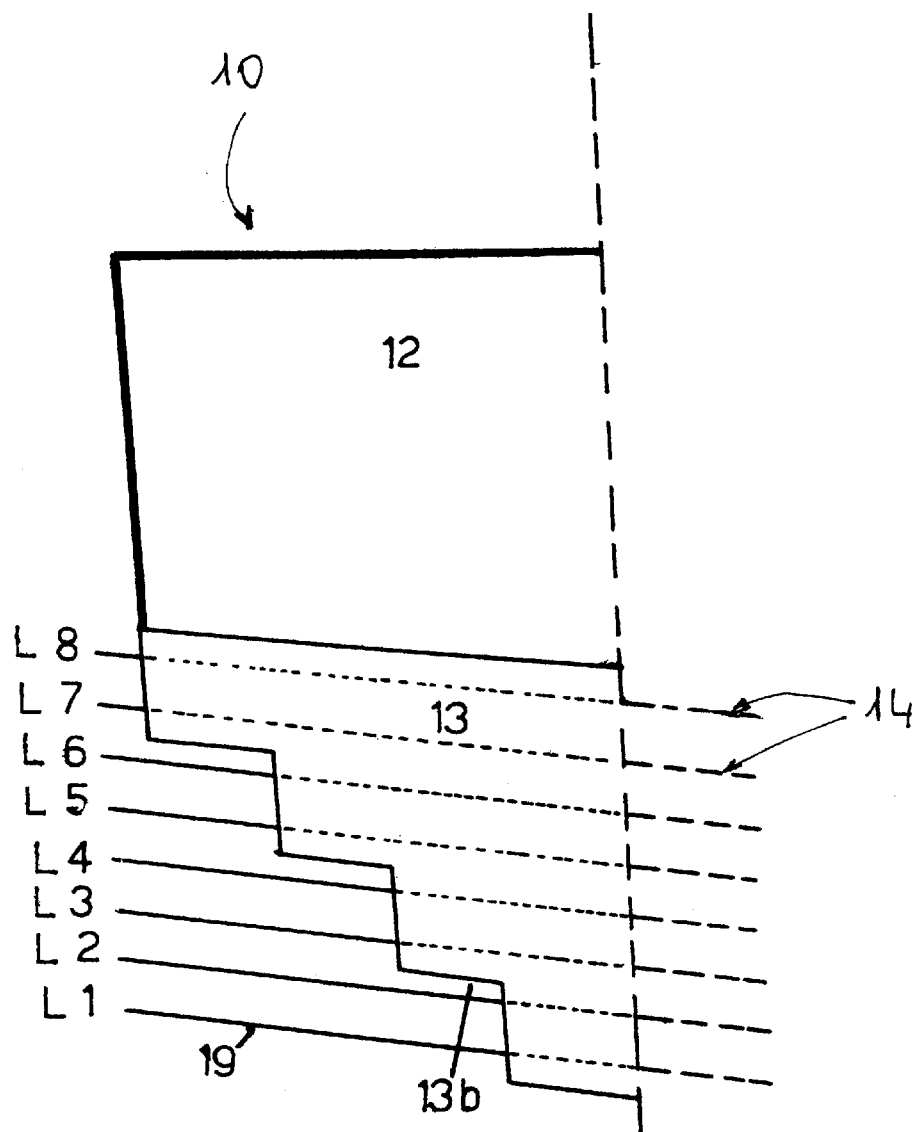
FIG. 9 is a schematic sectional view of a testing head having cantilever probes according to an embodiment of the invention.

With reference to FIG. 9, a testing head 10 according to an embodiment of the invention, being employed to test at least one device, is shown. The testing head 10 comprises at least one backing ring 12 having a resin holder 13 suitable to hold a plurality of probes 14.

The probes 14 are arranged in plural rows L1, L2, . . . , Ln in order to increase their density, it being possible for the probes to be laid in a pattern of either diagonal or straight or combination lines, depending on individual requirements.

Advantageously according to a preferred embodiment of the invention, the holder 13 has a suitably shaped outline 13b in correspondence of outer sections 19 of the probes 14, i.e. in correspondence of a region of a PC board (not shown) where the probes 14 are soldered on the board.

In particular, the outline 13b shows a plurality of steps helping the detection of specific probes within the bunch of probes that emerge from the resin holder 13, by virtue of the probe selection having been restricted to no more than one or a small number of probe rows.

In a preferred embodiment of the invention, the outline 13b includes a plurality of steps, all with the same width and height. In particular, the outline 13b has as many steps as many the rows of probes 14 are.

According to an alternative embodiment the outline 13b is provided with a number of steps which is a submultiple of the number of rows, with each step defining points of emergence of more than one row of probes 14.

Figure 11:
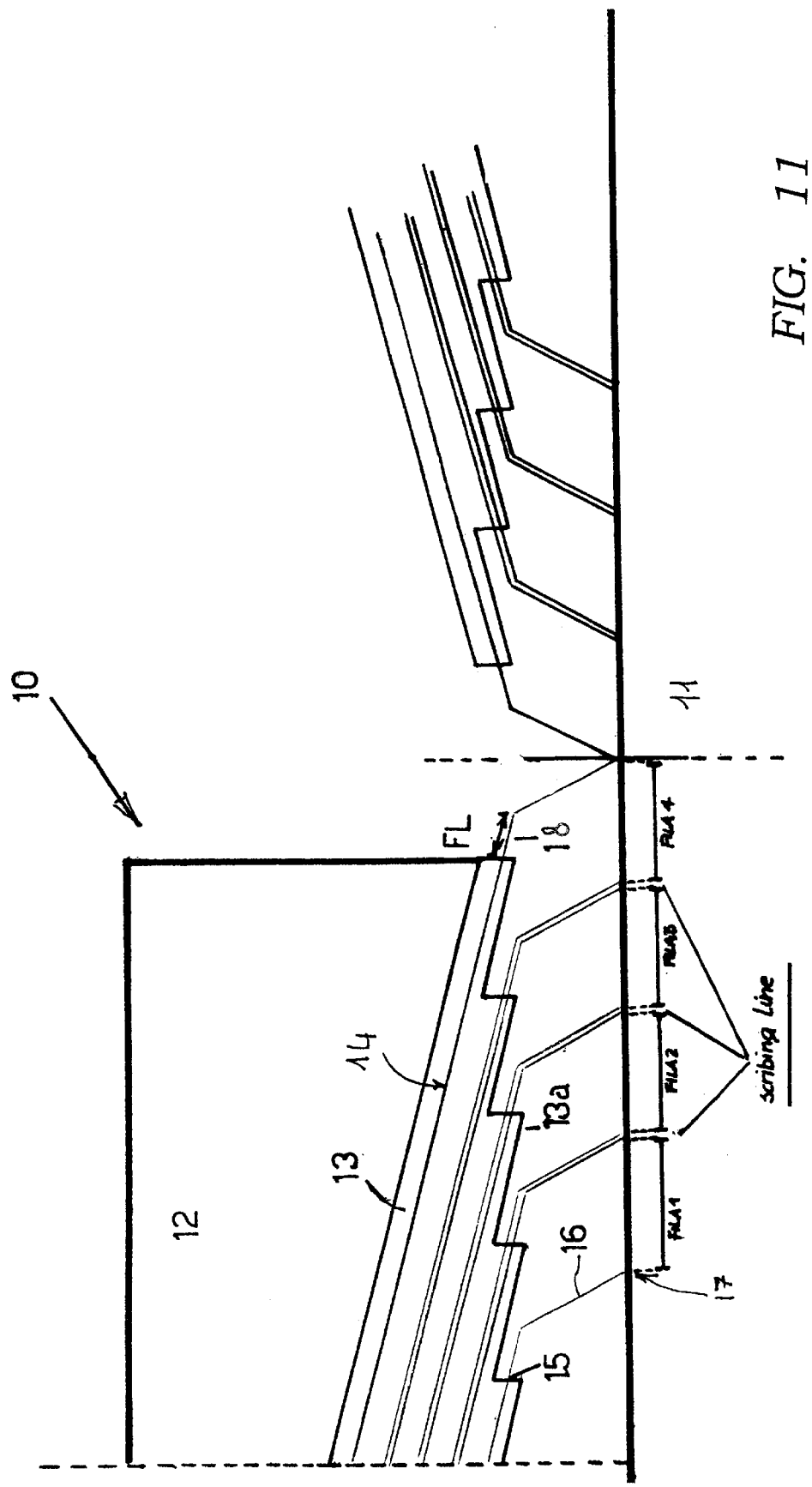
FIG. 11 is a schematic sectional view of the testing head having cantilever probes according to a further embodiment of the invention.

Assuming the probes 14 to be arranged in eight rows L1–L8, the outline 13b of the resin holder 13, as shown in FIG. 11, has four steps, with each step defining the points of emergence of two rows of probes 14. This is given by way of non-limiting example of a testing head according to an embodiment of the invention.

The number of rows per step may be varied, even within the same testing head, to meet specific requirements. It should be noted that one probe row might include probes placed at different heights above the plane containing the plurality of devices 11 to be tested.

In this way, soldering an unlimited number of probes, in different rows, can be made easier by providing the outline 13b with an appropriate number of steps.

Figure 10:
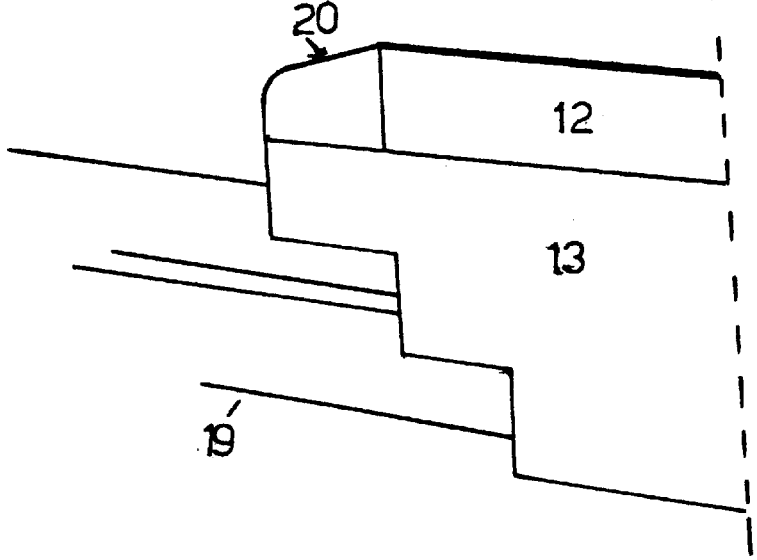
FIG. 10 is a schematic sectional view of a testing head having cantilever probes according to the embodiment of FIG. 9.

Advantageously according to embodiments of the invention, the resin holder 13 has a larger size than the backing ring 12, e.g. by adding final filling resin 20 to blend these elements to each other, as schematically shown in FIG. 10.

Shown in FIG. 11 is testing head 10 according to a further embodiment of the invention. The testing head 10, for application to a plurality of devices 11 to be tested, comprises at least one backing ring 12 having a resin holder 13 for holding a plurality of probes 14.

In particular, the probes 14 have an end portion or contact tip 16 that is bent through a suitable angle from the probes to contact a plurality of contact pads 17 on said plurality of devices 11 to be tested.

Furthermore, the probes 14 are arranged in several rows L1, L2, ..., Ln for increasing their density, the probe layout in front view being a pattern of diagonal or straight or combination lines, depending on individual requirements.

Good contacting of the contact pads 17 of the device to be tested by the probes 14 of the testing head 10 is conventionally ensured by the pressure of the testing head 10 on the device, the probes 14 vertically flexing in the opposite direction from the device direction of advance toward the testing head 10.

Advantageously according to embodiments of the invention, the holder 13 has a suitably shaped outline 13a in correspondence of the jutting sections or free lengths 18 of the probes 14, i.e. in correspondence of the devices to be tested.

In particular, the outline 13a shows a plurality of steps having shape and dimensions suitably selected to ensure an even pressure of the probes 14 on the contact pads 17 as the devices to be tested are brought to contact the testing head 10.

In a preferred embodiment of the testing head 10, schematically shown in FIG. 11, the holder 13 has a saw-tooth outline 13a, establishing a common level of emergence for said probes 14. In other words, the points 15 of emergence of the probes 14 from the resin holder 13 lie on a parallel plane to the plane containing the plurality of devices 11 to be tested, but are shifted in position from one another in order to reach contact pads 17 on different devices.

Advantageously according to a preferred embodiment of the invention, the probes 14 have all jutting sections or free lengths 18 that jut equally out of the emergence points 15. Thus, a plurality of devices 11 laid in several parallel rows can be tested by using equally dimensioned probes formed out of the same materials, at the same time as the proper pressure can be maintained on the contact pads 17 of devices lying in different rows, as schematically shown in FIG. 11.

It can be seen in FIG. 11 that the probes in touch with pads located in adjacent device rows spaced a predetermined distance apart, known as the "scribing line", belong to different rows but to the same step. In this case, a variation in the jutting sections or free lengths 18 must be provided. However, this variation is far less than in conventional testing heads, and can be readily compensated by altering the probe dimensions, e.g. varying the shape of the probe tip.

In addition, the testing heads 10 according to embodiments of the invention obviate the shortcomings of conventional testing heads having cantilever probes, and allow a matrix array of devices laid serially in plural rows to be tested.

In particular, the density of those probes 14 which are to test devices placed farther inwards of the backing ring 12 is the same as the density of the probes 14 used for testing devices placed next to the backing ring 12, thus providing for an equal density of contact pads 17 on the devices to be tested, regardless of their positions in a matrix array.

To summarize, the testing heads 10 according to embodiments of the invention allow probes 14 of equal size and formed out of the same material to be used for testing a matrix array of devices having an unlimited number of rows and columns.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. Testing head having cantilever probes and comprising:
   a backing ring
   a holder attached to the backing ring; and
   a plurality of contact probes held by the holder and formed with respective contact tips arranged to mechanically and electrically contact a plurality of contact pads of at least one device to be tested,
   wherein the holder has a shaped outline that includes a plurality of steps, connected to each other by a support portion of the holder, to allow different probe rows to emerge in a cantilever manner, the holder being a unitary piece of material such that the steps and the support portion are of the same unitary piece of material.

2. The testing head of claim 1, wherein said shaped outline is provided in correspondence of an outer section for soldering said probes.

3. The testing head of claim 1, wherein each step of the shaped outline holds probes in a same row.

4. The testing head of claim 1, wherein each step of the shaped outline holds probes in different rows.

5. The testing head of claim 1, wherein said shaped outline of the holder is positioned in correspondence of said device to be tested.

6. The testing head of claim 5, wherein said shaped outline of the holder is a saw-tooth outline, whereby the emerging points of said probes from said holder lie on a parallel plane to the plane containing said device to be tested.

7. The testing head of claim 6, wherein said shaped outline produces jutting sections of said probes from the holder that are substantially identical with one another.

8. The testing head of claim 1, wherein the holder is formed with another shaped outline in correspondence of said device to be tested.

9. The testing head of claim 8, wherein said another shaped outline of the holder is a saw-tooth outline, whereby the emerging points of said probes from said holder lie on a parallel plane to the plane containing said device to be tested.

10. The testing head of claims 1, further comprising a plurality of probes arranged in rows to test a matrix array of devices serially laid in rows, each device in said array being reached by probes of different rows.

11. The testing head of claim 1, wherein said holder is larger than said backing ring.

12. The testing head of claim 1, wherein said holder is a resin holder.

13. The testing head of claim 1, further comprising a finishing filler resin to blend together said holder and said backing ring.

14. Testing head having cantilever probes and comprising:
a holder; and
a plurality of contact probes held by the holder and formed with respective contact tips arranged to mechanically and electrically contact a plurality of contact pads of at least one device to be tested,
wherein the holder is structured to hold said contact probes, holder including a plurality of steps to allow a plurality of probe rows to emerge in a cantilever manner, the plurality of steps including first and second steps each with first and second surfaces, the first surface of the first step extending directly from a first end of the second surface of the first step in a first direction, and the first surface of the second step extending directly from a second end of the second surface of the first step in a second direction opposite to the first direction.

15. The testing head of claim 14, wherein the second surface of the first step extends directly from a first end of the first surface of the second step in a third direction, and the second surface of the second step extends directly from a second end of the first surface of the second step in a fourth direction opposite to the third direction.

16. The testing head of claim 14, wherein said steps are provided in correspondence of an outer section for soldering said probes.

17. The testing head of claim 14, wherein each step holds probes in a same row.

18. The testing head of claim 14, wherein each step holds probes in different rows.

19. The testing head of claim 14, wherein said steps of the holder are positioned in correspondence of said device to be tested.

20. The testing head of claim 14, wherein said steps from a saw-tooth outline, whereby emerging points of said probes from said holder lie on a parallel plane to a plane containing said device to be tested.

21. The testing head of claim 14, wherein said steps produces jutting sections of said probes from the holder that are substantially identical with one another.

22. The testing head of claim 14, wherein the holder is formed with a shaped outline in correspondence of said device to be tested.

23. The testing head of claim 22, wherein said shaped outline, is a saw-tooth outline, whereby emerging points of said probes from said holder lie on a parallel plane to a plane containing said device to be tested.

24. The testing head of claim 14, further comprising a plurality of probes arranged in rows to test a matrix array of devices serially laid in rows, each device in said array being reached by probes of different rows.

25. The testing head of claim 14, wherein said holder is attached to a backing ring.

26. The testing head of claim 25, wherein said holder is a resin holder.

27. The testing head of claim 25, wherein said holder is larger than said backing ring.

28. The testing head of claim 25, further comprising a finishing filler resin to blend together said holder and said backing ring.

29. A method for creating an electro/mechanical connection between a testing head and a test device, the method comprising: and holding a plurality of contact probes in the testing head in a cantilever manner, the contact probes having contact tips bent through suitable angles from the contact probes to contact a plurality of contact pads on a test device;

establishing a common level of emergence for the contact probes from an holder of the testing head, the points of emergence of the contact probes lying on a parallel plane to the plane of the test device, and being shifted in position from one another in order to reach different contact pads, wherein establishing a common level of emergence for the contact probes from an holder of the testing head comprises providing a holder having a shaped outline that includes a plurality of steps, connected to each other by a support portion of the holder, to allow probe rows to emerge in a cantilever manner, the holder being a unitary piece of material such that the steps and the support portion are of the same unitary piece of material;

causing the contacting tips of the contact probes to abut against the contact pads as the test device is pressed against the contacting tips;

causing the contact probes to vertically flexing in the opposite direction from the device direction of advance toward the testing head.

30. The method of claim 29, wherein said shaped outline is provided in correspondence of an outer section for soldering said probes.

31. The method of claim 29, wherein each step of the shaped outline holds probes in a same row.

32. The method of claim 29, wherein each step of the shaped outline holds probes in different rows.

33. The method of claim 29, wherein said shaped outline of the holder is positioned in correspondence of said test device.

34. The method of claim 33, wherein said shaped outline of the holder is a saw-tooth outline, whereby emerging points of said probes from said holder lie on a parallel plane to the plane containing said test device.

35. The method of claim 34, wherein said shaped outline produces jutting sections of said probes from the holder that are substantially identical with one another.

36. The method of claim 29, wherein the holder is formed with another shaped outline in correspondence of said test device.

37. The method of claim 36, wherein said another shaped outline of the holder is a saw-tooth outline, whereby emerging points of said probes from said holder lie on a parallel plane to a plane containing said test device.

38. The method of claim 29, further comprising, before the contact pad touches the contacting tip:
blending together said holder and a backing ring by means of a finishing filler resin.

39. A method for creating an electro/mechanical connection between a testing head and a plurality of test devices, the method comprising:
holding a plurality of contact probes in the testing head in a cantilever manner, the contact probes having contact tips bent through suitable angles from the contact probes to contact a plurality of contact pads on the plane containing the plurality of test devices;

establishing a common level of emergence for the contact probes from a holder of the testing head, the points of emergence of the contact probes lying on a parallel plane to the plane containing the plurality of test devices, and being shifted in position from one another in order to reach contact pads of different test devices, the holder including a shaped outline that includes a plurality of steps to allow a plurality of probe rows to emerge in a cantilever manner, the plurality of steps including first and second steps each with first and second surfaces, the first surface of the first step extending directly from a first end of the second surface of the first step in a first direction, and the first surface of the second step extending directly from a second end of the second surface of the first step in a second direction opposite to the first direction;

causing the contacting tips of the contact probes to abut against the contact pads as the plurality of test devices is pressed against the contacting tips; and causing the contact probes to vertically flexing in the opposite direction from the devices direction of advance toward the testing head.

40. The method of claim 39, wherein said plurality of probes is arranged in rows to test a matrix array of devices serially laid in rows, each device in said array being reached by probes of different rows.

41. The method of claim 39, wherein said shaped outline is provided in correspondence of an outer section for soldering said probes.

42. The method of claim 39, wherein each step of the shaped outline holds probes in a same row.

43. The method of claim 39, wherein each step of the shaped outline holds probes in different rows.

44. The method of claim 39, wherein said shaped outline of the holder is positioned in correspondence of said plurality of test devices.

45. The method of claim 44, wherein said shaped outline of the holder is a saw-tooth outline, whereby emerging points of said probes from said holder lie on a parallel plane to a plane containing said plurality of test devices.

46. The method of claim 45, wherein said shaped outline produces jutting sections of said probes from the holder that are substantially identical with one another.

47. The method of claim 39, wherein the holder is formed with another shaped outline in correspondence of said plurality of test devices.

48. The method of claim 47, wherein said another shaped outline of the holder is a saw-tooth outline, whereby emerging points of said probes from said holder lie on a parallel plane to a plane containing said plurality of test devices.

49. The method of claim 39, further comprising, before the contact pad touches the contacting tip:

blending together said holder and a backing ring by means of a finishing filler resin.

* * * * *

UNITED STATES PATENT AND TRADEMARK OFFICE
CERTIFICATE OF CORRECTION

PATENT NO.    : 6,674,298 B2
DATED         : January 6, 2004
INVENTOR(S)   : Stefano Felici et al.

It is certified that error appears in the above-identified patent and that said Letters Patent is hereby corrected as shown below:

Column 7,
Line 13, "holder including" should read as -- the holder including --.
Line 38, "steps from a saw-tooth outline," should read as -- steps form a saw-tooth outline, --.
Lines 48 and 49, "said shaped outline," should read as -- said shaped outline --.

Signed and Sealed this

Sixth Day of September, 2005

JON W. DUDAS
*Director of the United States Patent and Trademark Office*